United States Patent
Henniger et al.

(10) Patent No.: US 9,839,150 B2
(45) Date of Patent: Dec. 5, 2017

(54) MULTI-STAGE SEALING SYSTEM FOR USE IN A MOTOR VEHICLE CONTROL UNIT

(71) Applicant: CONTI TEMIC MICROELECTRONIC GMBH, Nuremberg (DE)

(72) Inventors: Juergen Henniger, Erlangen-Dechsendorf (DE); Matthias Wieczorek, Neunkirchen am Sand (DE); Andreas Reif, Roethenbach (DE); Marion Gebhardt, Graefenberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 19 days.

(21) Appl. No.: 14/903,442

(22) PCT Filed: May 12, 2014

(86) PCT No.: PCT/EP2014/059629
§ 371 (c)(1),
(2) Date: Jan. 7, 2016

(87) PCT Pub. No.: WO2015/014509
PCT Pub. Date: Feb. 5, 2015

(65) Prior Publication Data
US 2016/0205796 A1   Jul. 14, 2016

(30) Foreign Application Priority Data

Aug. 1, 2013   (DE) .................. 10 2013 215 149

(51) Int. Cl.
*H05K 5/02* (2006.01)
*F16J 15/00* (2006.01)
(Continued)

(52) U.S. Cl.
CPC ....... *H05K 5/0217* (2013.01); *B60R 16/0231* (2013.01); *F16J 15/002* (2013.01);
(Continued)

(58) Field of Classification Search
CPC ...... H05K 5/0082; H05K 5/061; H05K 5/062; H05K 5/063
See application file for complete search history.

(56) References Cited

U.S. PATENT DOCUMENTS 3,676,292 A   7/1972 Pryor, et al.
4,774,383 A   9/1988 Dalton, Jr.
(Continued)

FOREIGN PATENT DOCUMENTS

DE         2150092 A1   4/1972
DE    102005002813 B4   10/2006
(Continued)

*Primary Examiner* — Hoa C Nguyen
*Assistant Examiner* — Christopher L Augustin
(74) *Attorney, Agent, or Firm* — Laurence A. Greenberg; Werner H. Stemer; Ralph E. Locher

(57) ABSTRACT

A multi-part sealing system is provided for a housing of a motor vehicle control unit. The housing includes a first housing part and at least one additional housing part, with at least one electronic component in the interior of the housing and at least one conducting structure which leads out of the interior of the housing and connects an electronic component in the interior of the housing to components outside the housing in an electrically conductive manner. At least one housing part has at least one device for accommodating at least one part of the multi-part sealing system. A first part of the sealing system is suitable for preventing liquid harmful or noxious substances from penetrating into the interior of the housing and additional parts of the sealing system are suitable for preventing gaseous harmful or noxious substances from penetrating into the interior of the housing.

14 Claims, 2 Drawing Sheets

(51) Int. Cl.
  *B60R 16/023* (2006.01)
  *H01L 23/10* (2006.01)
(52) U.S. Cl.
  CPC ........... *H01L 23/10* (2013.01); *H05K 5/0247* (2013.01); *H01L 2224/48091* (2013.01); *H01L 2924/0002* (2013.01)

(56) References Cited

U.S. PATENT DOCUMENTS

| | | | |
|---|---|---|---|
| 5,155,299 A | 10/1992 | Mahulikar et al. | |
| 7,656,674 B2 * | 2/2010 | Wetzel | F16H 61/0006 361/752 |
| 8,059,407 B2 | 11/2011 | Eglinger et al. | |
| 2001/0040037 A1 * | 11/2001 | Negishi | H05K 5/061 174/17 CT |
| 2006/0023431 A1 * | 2/2006 | Wetzel | B60R 16/0239 361/739 |
| 2007/0131444 A1 | 6/2007 | Shadel et al. | |
| 2007/0230137 A1 * | 10/2007 | Inagaki | B60R 16/0239 361/719 |
| 2008/0002377 A1 * | 1/2008 | Kamoshida | H05K 5/0052 361/752 |
| 2009/0002959 A1 * | 1/2009 | Loibl | H01R 13/5202 361/749 |
| 2010/0103632 A1 * | 4/2010 | Kato | H05K 5/006 361/752 |
| 2010/0149763 A1 * | 6/2010 | Wetzel | H05K 5/0082 361/749 |
| 2010/0177483 A1 * | 7/2010 | Yoshimoto | H05K 3/284 361/714 |
| 2010/0202110 A1 * | 8/2010 | Becker | H05K 5/0082 361/707 |
| 2012/0320544 A1 * | 12/2012 | Ohhashi | H05K 5/0052 361/752 |
| 2014/0070411 A1 | 3/2014 | Okada | |
| 2015/0240134 A1 * | 8/2015 | Keite-Telgenbuscher | C09J 127/16 156/322 |

FOREIGN PATENT DOCUMENTS

| | | |
|---|---|---|
| DE | 102006049592 A1 | 4/2008 |
| DE | 102006050801 B4 | 4/2012 |
| GB | 2180896 A | 4/1987 |
| WO | 2009021777 A2 | 2/2009 |
| WO | 2012165647 A1 | 12/2012 |

* cited by examiner

MULTI-STAGE SEALING SYSTEM FOR USE IN A MOTOR VEHICLE CONTROL UNIT

BACKGROUND OF THE INVENTION

Field of the Invention

The invention relates to a multi-part sealing system for a housing of a motor vehicle control unit, in which the housing is composed of a first housing part and at least one further housing part, having at least one electronic component in the interior of the housing, and at least one conductor structure which leads out of the interior of the housing between the housing parts and connects an electronic component in the interior of the housing to components outside the housing in an electrically conductive fashion. The invention also relates to a control unit, in particular for a motor vehicle, having a housing composed of a first housing part and at least one further housing part, having at least one electronic component in the interior of the housing, and at least one conductor structure which leads out of the interior of the housing and connects the circuit carrier or an electronic component in the interior of the housing to components outside the housing in an electrically conductive fashion.

In motor vehicle construction it has been customary for a relatively long time to integrate control units for the engine or transmission into the motor vehicle assembly to be controlled, that is to say the engine or transmission. In particular, the transmission control units form, as what is referred to as a local control unit, an extremely compact unit. Compared to the conventional use of external add-on control units, this arrangement has enormous advantages with respect to quality, costs, weight and functionality. In particular, it results in a considerable reduction in plug-in connections and lines which are susceptible to faults under certain circumstances.

The integration of the control unit into the transmission makes stringent requirements of its thermal and mechanical resilience. The functionality must be ensured both over a wide temperature range (approximately −40° C. up to 200° C.) as well as in the case of mechanical vibrations (up to approximately 40 g). The housing of the control unit requires, in particular, a stable, reliable sealing system which has, in particular, a high level of mechanical strength and is resistant to high pressures and high temperatures and to noxious substances such as oil and sulfur-containing gases.

In particular, sulfur-containing noxious gases can pass, through diffusion from the outside, into the interior of the control unit housing through the seal and bring about damage to the electronic functional components such as the microcontroller as well as bond pads or bond wires. This can, under certain circumstances, result in total failure of the control units long before their predicted expected service life.

If, in particular, metal-containing components in the interior of the transmission control units come into contact with corrosive media such as sulfur-containing gases, water or moist air, the latter attack the metal and corrode it.

BRIEF SUMMARY OF THE INVENTION

An object of the present invention is therefore to develop a sealing system for a housing of a motor vehicle control unit of the type mentioned at the beginning in such a way that the sealing function is easily improved.

This object is achieved as claimed in the invention by means of a sealing system having the features described below.

As claimed in the invention it has been recognized that the sealing function of a housing, which surrounds a first and at least one further housing part, of a motor vehicle control unit is improved by virtue of the fact that the sealing system is embodied in a multi-step fashion. In this context, at least one housing part has at least one device, for example a groove, for accommodating at least part of the multi-part sealing system wherein, in particular, the first part of the sealing system is suitable for preventing liquid noxious substances such as oil from penetrating into the interior of the housing.

The further parts of the sealing system are suitable, in particular, for keeping gaseous noxious substances, in particular sulfur-containing gases, away from the electronic space of the housing, in order to prevent damage, in particular, to the electronic functional components such as microcontrollers.

In this context, one part of the sealing system is advantageously embodied as a solid seal, for example made of plastic such as elastomers, or as an adhesive, for example two-component epoxy bonding agent. A further part of the sealing system can also be embodied as a catalytically acting component, that is to say can convert noxious components from the surroundings selectively into non-damaging components. A component with a purely filtering property would also be conceivable. A further part of the sealing system can also be embodied as a getter layer, for example composed of a metal such as aluminum, copper, silver, or a silver-palladium alloy or steel, in order to bind noxious components from the surroundings. The getter layer can also be a metal foam such as, for example, sintered material, in order to present a very large surface over a small volume.

In particular, the solid seal as a first sealing stage is distinguished in particular by a high level of cohesion, that is to say by a high degree of internal strength, and is as a result particularly suitable for preventing, in particular, oils from penetrating into the interior of the control unit at high pressures and also high temperatures.

In particular, the getter layer is, in contrast, distinguished, in particular, by a high level of adhesion to the housing material, in particular to the device of a housing part, which is provided for accommodating a part of the sealing system. Said getter layer is therefore particularly suitable for preventing gaseous substances such as, for example, sulfur-containing gases from penetrating into the interior of the control unit.

For reasons of space, a combination of the parts of the sealing system would also be conceivable. For example, the outer surface of a solid seal could additionally be provided with an adhesive or a getter layer.

The devices for accommodating a part of the sealing system are generally arranged in one of the housing parts. In the case of a housing which is composed of a housing lid and a housing base, which is embodied, for example, as a base plate, such a device is embodied, for example, as a groove in the sealing surface of the housing lid. However, the groove could also be arranged in the housing base. The various parts of the sealing system can be arranged in any desired sequence from the inside to the outside in the corresponding devices. It is therefore possible to arrange each part in a separate device. However, it can also be the case that at least two parts of the sealing system are arranged in a single device, in particular in the case of restricted spatial conditions.

Generally it will be the case that the first seal which impedes oil is attached in the direction of the outer wall of the housing, that is to say in the direction of the surrounding oil. Since this seal can specifically prevent the ingress of oil, but is normally not suitable for preventing completely the ingress of gaseous substances, a further seal, which is particularly suitable for the latter purpose, must perform this function, which further seal must in turn not necessarily impede oil and also does not even have to be oil-resistant.

As a result of this multi-stage sealing system it is achieved, in particular, that the different requirements which are made of the sealing system are distributed among different, generally cost-effective parts, with different specific properties, since generally it is not possible to implement all the requirements made of a sealing system of a control unit in a single, even affordable, sealing component.

The conductor structure which leads out of the interior of the housing and connects an electronic component in the interior of the housing to components outside the housing in an electrically conductive fashion can, depending on the application case, be embodied as a flexible film conductor or short flex film conductor, as a rigid conductor circuit board, as a cut matrix or as a cable. In this context, open contact regions are arranged in each case at an end section of the conductor structure.

In particular, one or more electronic components can be arranged on the conductor structure or on a separate circuit carrier. In the latter case, the electronic components are electrically connected to the circuit carrier with the open contact regions of the conductor structure for example with bond wires.

It would also be conceivable for the electronic components to be arranged both on the conductor structure and on the separate circuit carrier.

A further object consists in providing a control unit of the typed mentioned at the beginning which has an improved sealing system.

The features of the control unit as claimed in the invention in particular and the advantages thereof correspond to those of the sealing system as claimed in the invention as described above.

BRIEF DESCRIPTION OF THE SEVERAL VIEWS OF THE DRAWING

Further features, advantages and details of the invention can be found in the following description in which a preferred exemplary embodiment is explained in more detail on the basis of the appended drawings. These show.

In said drawings.

DESCRIPTION OF THE INVENTION

Figure 1:
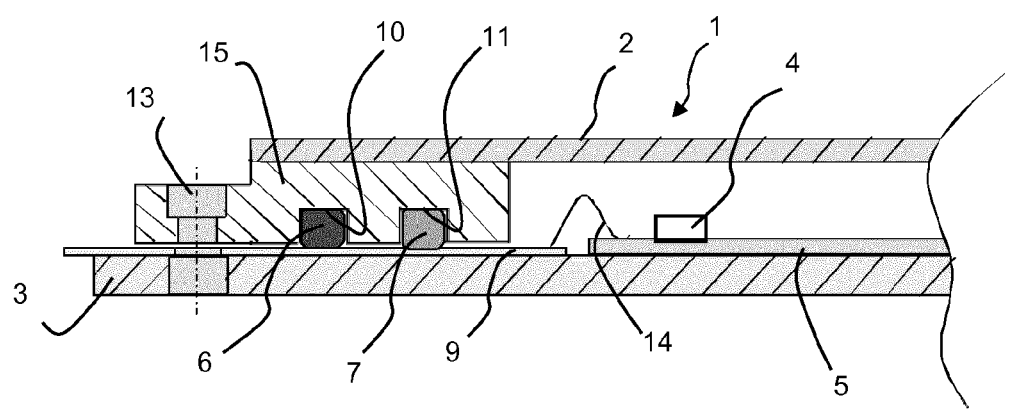
FIG. 1 shows a section through a control unit, having two parts of the sealing system in respectively separate devices.

FIG. 1 shows a control unit with a housing 1 which comprises a first housing part 2 which is embodied as a lid and a second housing part 3 which is embodied as a baseplate or bottom plate. Between the first and second housing parts there is arranged here a third housing part 15, embodied as a separate receptacle of the sealing system 6, 7, 8. This separate receptacle could also be embodied as an integral part of either the first housing part 2 or else of the second housing part 3. The receptacle 15 has devices 10, 11 for accommodating parts of the sealing system 6, 7, 8. In this case, the first part 6 and the second part 7 are accommodated in respectively separate devices 10, 11 which are formed here as a groove. The means of securement 13 of the housing parts 2, 3 to one another is embodied, in particular, as a screw or as a rivet.

The first, oil-impeding seal 6 of the sealing system is attached in the direction of the outer wall of the housing 1, that is to say in the direction of the surrounding oil. This seal 6 is specifically suitable for preventing the ingress of oil into the interior of the control unit. Gaseous substances are generally at least partially led through this seal 6. Therefore, the further seal 7 is attached next to the first seal 6 in the direction of the interior of the control unit in the separate device 11. The sequence of the arrangement of the two seals 6, 7 could also be interchanged.

The first part 6 of the sealing system is embodied, in particular, as a solid seal, for example made of plastic such as elastomers. This first part 6 is distinguished, in particular, by a high degree of cohesion, that is to say by a high degree of inner strength, and is, as a result, particularly suitable for preventing, in particular, oils from penetrating into the interior of the control unit even under extreme external conditions such as high pressures and high temperatures. The first part 6 of the sealing system can also be embodied as an adhesive, for example a two-component epoxide bonding agent.

A further part 7, 8 of the sealing system can be embodied as a getter layer, for example, composed of a metal such as aluminum, copper, silver, a silver-palladium alloy or steel or likewise as an adhesive. The further parts 7, 8 of the sealing system can, however, also be configured as a filter or catalytic converter for filtering or converting noxious components from the surroundings. These further components 7, 8 are distinguished, in particular, by a high degree of adhesion, in particular to the housing material, here the material of the device 11 of the third housing part 15. They are, as a result, particularly suitable for preventing gaseous substances such as, for example, sulfur-containing gases, from passing through the contact surface between the seal 7 and parts surrounding the seal 7, and for binding them, in order to delay sufficiently any damage to electronic functional components in the interior of the housing, at least for the service life of the control unit.

An electronic component 4 is arranged on a circuit carrier 5 in the interior of the housing 1. A plurality of electronic components 4, also different ones, such as, for example, processors, transistors or passive components, can also be mounted on the circuit carrier 5. The circuit carrier 5 can be, for example, a conventional PCB or a ceramic circuit carrier.

The electrically conductive connection between the component 4 or components 4 in the interior of the housing 1 and components outside the housing 1 is produced by a conductor structure 9.

This conductor structure 9 can, depending on the application, be embodied as a flexible film conductor, as a rigid conductor circuit board, as a cut matrix or as a cable. In this context, open contact regions are arranged in each case at an end section of the conductor structure 9 in a way which is not shown. In the case of a flexible conductor circuit board as a conductor structure 9, the latter is generally bonded or laminated onto the baseplate 3.

The electrically conductive connection between the electrical components 4 and the open contact regions of the conductor structure 9 is produced here by means of a bond wire 14.

Control unit embodiments in which it is possible to dispense with a circuit carrier 5 are also conceivable. Then the electronic components 4 are mounted directly on the conductor structure 9.

Figure 2:
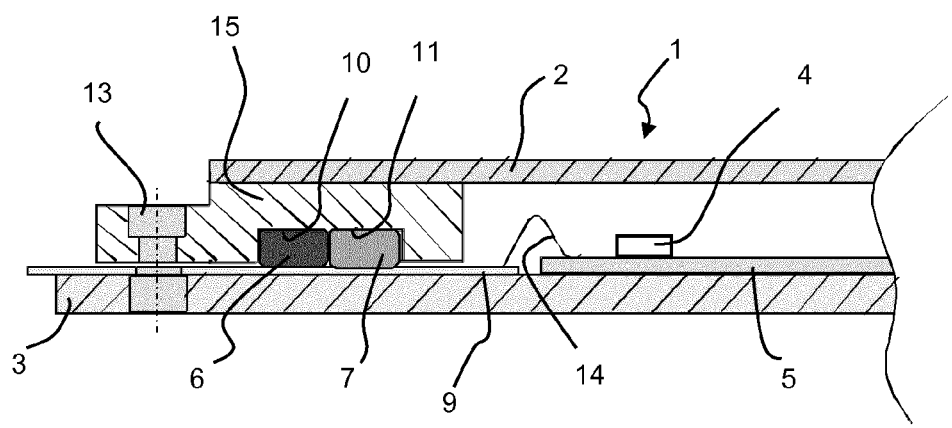
FIG. 2 shows a section through a control unit, with two parts of the sealing system in a single device.

FIG. 2 shows a control unit, in which devices 10 and 11 are combined to form a single device for accommodating the seals 6 and 7. In particular, the seals 6 and 7 can be arranged in any desired sequence here also.

Figure 3:
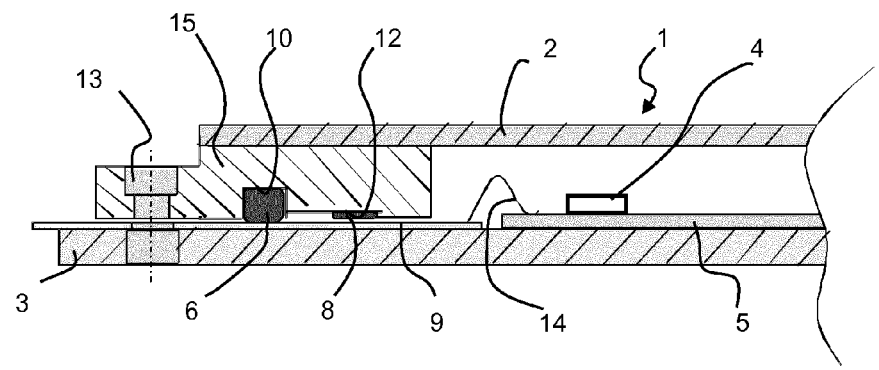
FIG. 3 shows a section through a control unit, with two parts of the sealing system which are different from FIG. 1 and are in respectively separate devices.

FIG. 3 shows a control unit with two parts 6, 8 of the sealing system, in which, as in the embodiment from FIG. 1, the two components 6, 8 are accommodated in respectively separate devices 10, 12 which are embodied as a groove. In contrast to FIG. 1, the second, gas-impeding seal 8 is embodied as a thin getter layer or a layer made of adhesive. The seals 6 and 8 can generally be arranged in any desired sequence here also. Owing to space problems, a combination of parts 6 and 8 of the sealing system would also be conceivable. For example, the outer face of the seal 6 could additionally be provided with an adhesive or a getter layer. This embodiment is not shown.

Figure 4:
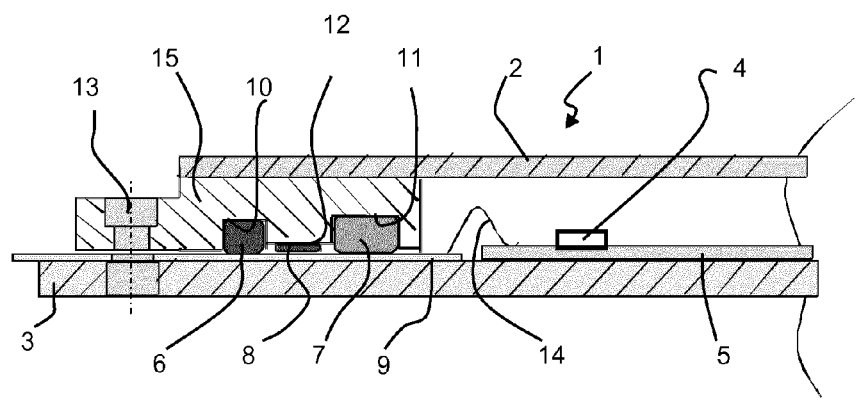
FIG. 4 shows a section through a control unit, with three parts of the sealing system in respectively separate devices.

FIG. 4 shows a control unit with three parts 6, 7, 8 of the sealing system, in which, as in the embodiment from FIGS. 1 and 3, parts 6, 7, 8 are accommodated in respectively separate devices 10, 11, 12 which are embodied as a groove. The seals 6, 7 and 8 can generally be arranged in any desired sequence here also.

As a result of this multi-stage sealing system, it is ensured, in particular, that the different requirements which are made of the sealing system of a housing, in particular of a housing for a motor vehicle transmission control unit, are distributed over different parts with different specific properties. These individual parts of the sealing system are generally more cost-effective to manufacture than a single sealing component which has to meet all the requirements.

LIST OF REFERENCE NUMERALS

1 Housing
2 First housing part
3 Second housing part
4 Electronic component
5 Circuit carrier
6 First part of the sealing system
7, 8 Further parts of the sealing system
9 Conductor structure
10, 11, 12 Device for accommodating the sealing system
13 Means of securing the first housing part to the second
14 Electrically conductive connecting line, bond wire
15 Separate accommodation of the sealing system, third housing part

The invention claimed is:

1. In a motor vehicle control unit including:
a housing having an interior, a first housing part and at least one further housing part,
at least one electronic component disposed in the interior of the housing, and
at least one conductor structure leading out of the interior of the housing between the housing parts for electrically conductively connecting the electronic component in the interior of the housing to components outside the housing,
an electrically conductive connection electrically connecting said conductor structure to the electronic component in the interior of the housing;
a multi-part sealing system for the housing, the multi-part sealing system comprising:
at least one device disposed in at least one of the housing parts for accommodating at least part of the multi-part sealing system;
a first part of the multi-part sealing system being specifically suitable for preventing liquid noxious substances from penetrating into the interior of the housing; and
further parts of the multi-part sealing system being specifically suitable for preventing gaseous noxious substances from penetrating into the interior of the housing;
said further parts of the multi-part sealing system being completely displaced away from said electrically conductive connection so that there is no physical contact between said electrically conductive connection and said further parts of the multi-part sealing system.

2. The multi-part sealing system according to claim 1, wherein one of said parts of the multi-part sealing system is an adhesive, a solid seal, a catalytic converter, a filter or a getter layer.

3. The multi-part sealing system according to claim 2, wherein said getter layer is composed of a metal.

4. The multi-part sealing system according to claim 3, wherein said metal is aluminum, copper, silver, a silver-palladium alloy or steel.

5. The multi-part sealing system according to claim 2, wherein said getter layer is applied to one of said parts of the multi-part sealing system.

6. The multi-part sealing system according to claim 1, wherein said parts of the multi-part sealing system are disposed between the housing parts and are disposed in any desired sequence in said devices.

7. The multi-part sealing system according to claim 1, wherein said at least one device includes a plurality of devices, and said parts of the multi-part sealing system are each disposed in a respective one of said devices in the housing.

8. The multi-part sealing system according to claim 1, wherein said at least one device is a single device, and at least two of said parts of the multi-part sealing system are disposed in said single device in the housing.

9. The multi-part sealing system according to claim 1, wherein the at least one conductor structure is a flex film conductor, a rigid conductor circuit board, a cut matrix or a cable with open contact regions each disposed at a respective end section.

10. The multi-part sealing system according to claim 1, wherein the at least one electronic component is disposed on the at least one conductor structure.

11. The multi-part sealing system according to claim 1, which further comprises a separate circuit carrier, the at least one electronic component being disposed on the separate circuit carrier.

12. The multi-part sealing system according to claim 1, which further comprises a separate circuit carrier, the at least one electronic component being disposed on the at least one conductor structure and the at least one electronic component being disposed on the separate circuit carrier.

13. A control unit, comprising:
a housing having an interior, a first housing part and at least one further housing part;
at least one electronic component disposed in said interior of said housing;

a circuit carrier disposed in said interior of said housing;

at least one conductor structure leading out of said interior of said housing for electrically conductively connecting said circuit carrier or said electronic component in said interior of said housing to components outside said housing;

an electrically conductive connection electrically connecting said conductor structure to said circuit carrier or said electronic component in said interior of said housing;

a multi-part sealing system between said housing parts, said multi-part sealing system having a first part being suitable for preventing liquid noxious substances from penetrating into said interior of said housing and said multi-part sealing system having further parts being suitable for preventing gaseous noxious substances from penetrating into said interior of said housing; and at least one of said housing parts having at least one device for accommodating at least part of said multi-part sealing system;

said further parts of the multi-part sealing system being completely displaced away from said electrically conductive connection so that there is no physical contact between said electrically conductive connection and said further parts of the multi-part sealing system.

14. The control unit according to claim 13, wherein the control unit is a motor vehicle control unit.

* * * * *